United States Patent
Takami et al.

[11] Patent Number: 5,970,004
[45] Date of Patent: Oct. 19, 1999

[54] SEMICONDUCTOR MEMORY DEVICE ALLOWING TEST REGARDLESS OF SPARE CELL ARRANGEMENT

[75] Inventors: Kazuhiko Takami; Kiyoomi Oshigoe; Mikio Asakura, all of Hyogo, Japan

[73] Assignee: Mitsubishi Denki Kabushiki Kaisha, Tokyo, Japan

[21] Appl. No.: 09/114,076

[22] Filed: Jul. 13, 1998

[30] Foreign Application Priority Data

Jan. 19, 1998 [JP] Japan .............................. 10-007360(P)

[51] Int. Cl.⁶ .............................. G11C 7/00; G11C 16/04; G11C 8/00
[52] U.S. Cl. ................. 365/200; 365/189.05; 365/230.08
[58] Field of Search .............................. 365/200, 189.05, 365/189.08, 230.06, 230.08, 201

[56] References Cited

U.S. PATENT DOCUMENTS 5,559,741 9/1996 Sobue ........................................ 365/200
5,748,641 5/1998 Ohsawa ..................................... 365/201

FOREIGN PATENT DOCUMENTS

| 62-040700 | 2/1987 | Japan . |
| 62-173700 | 7/1987 | Japan . |
| 63-052439 | 3/1988 | Japan . |
| 1-112598 | 5/1989 | Japan . |
| 5-274897 | 10/1993 | Japan . |
| 5-334897 | 12/1993 | Japan . |
| 8-007597 | 1/1996 | Japan . |

Primary Examiner—Trong Phan
Attorney, Agent, or Firm—McDermott, Will & Emery

[57] ABSTRACT

A semiconductor memory device according to the present invention includes a block determining portion determining a difference in arrangement between a normal cell and a spare cell which replaces it, a data scramble controlling circuit generating a scramble ON signal when a normal cell is replaced by a spare cell and the spare cell stores inverted data, a scramble circuit inverting data to be written in response to the scramble ON signal, and a scramble circuit inverting data to be read in response to the scramble ON signal.

5 Claims, 4 Drawing Sheets

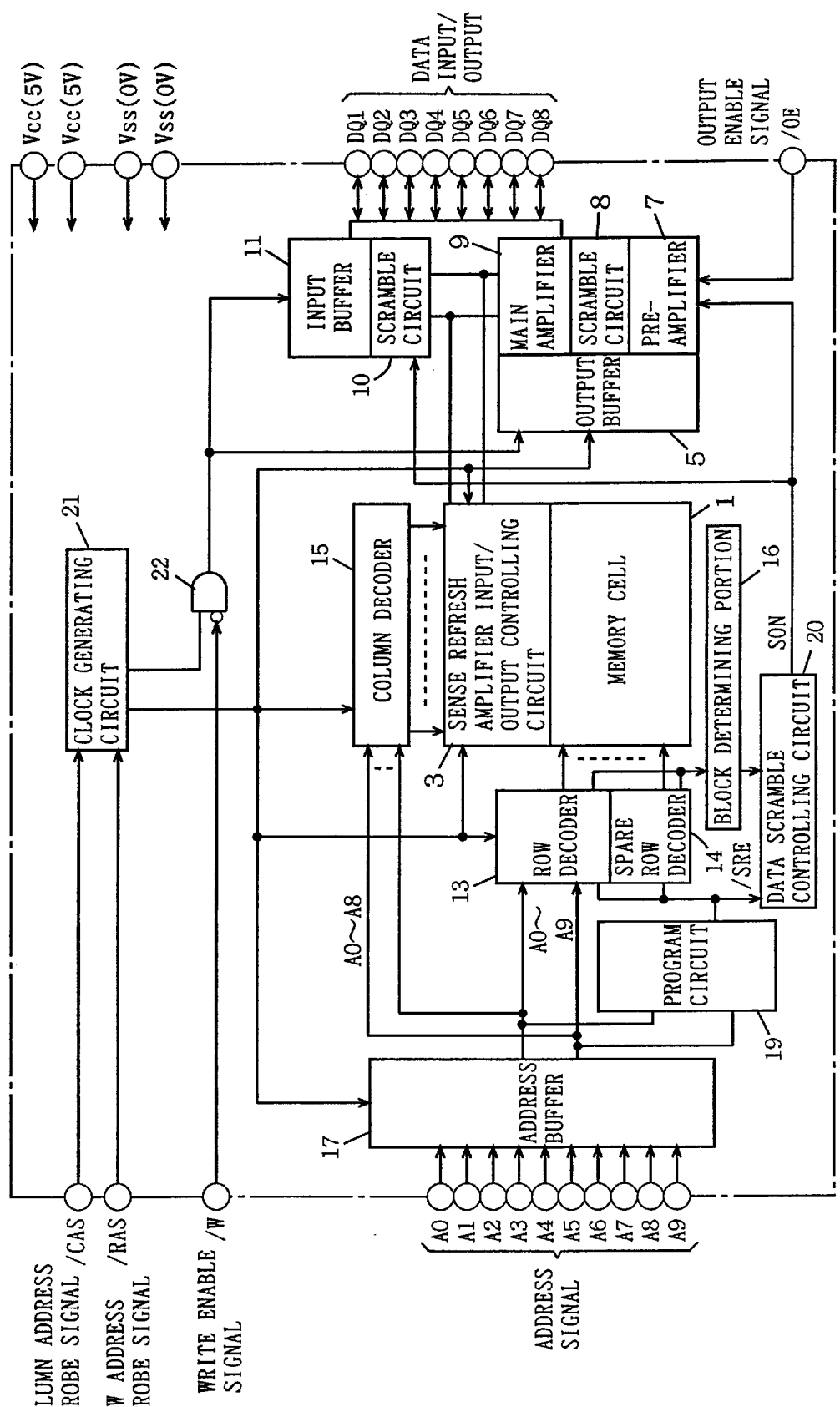
F I G. 1

SEMICONDUCTOR MEMORY DEVICE ALLOWING TEST REGARDLESS OF SPARE CELL ARRANGEMENT

BACKGROUND OF THE INVENTION

1. Field of the Invention

The present invention relates to a semiconductor memory device.

2. Description of the Background Art

FIGS. 7A and 7B illustrate data outputting and data inputting in a conventional, typical semiconductor memory device.

As shown in FIG. 7A, in the conventional semiconductor memory device, data stored in a memory cell 1 passes through a sense amplifier 3 and it is output from an output buffer 5. Here, output buffer 5 includes a preamplifier 7 and a main amplifier 9, and preamplifier 7 outputs a signal DBR.

As shown in FIG. 7B, in the conventional semiconductor memory device, data is input to memory cell 1 through an input buffer 11. Here, input buffer 11 outputs a signal DBW.

FIG. 8 shows memory cell arrangement using a quarter pitch in the conventional semiconductor memory device, in which a white circle indicates a memory cell connected to a bit line BL and storing data and a black circle indicates a memory cell connected to a bit line /BL and storing inverted data.

The memory cell array includes blocks A and B formed of normal cells and blocks C and D formed of spare cells SC. Even when a normal cell storing data (or inverted data) is replaced by a spare cell SC storing inverted data (or data), for example, when block A is replaced by block D having different cell arrangement, data has been read and written as it is.

However, when blocks A and B are replaced by blocks D and C, respectively, in FIG. 8, replaced spare cell SC stores the inverted data of data stored in the normal cell. Therefore, the stress imposed during a test cannot be applied to spare cell SC under the same condition as the normal cell.

SUMMARY OF THE INVENTION

An object of the present invention is to provide a semiconductor memory device allowing a test by application of stress regardless of spare cell SC arrangement when a normal cell is replaced by a spare cell SC.

According to one aspect of the present invention, the semiconductor memory device includes a word line, a spare word line, a bit line crossing the word line and the spare word line, at least one memory cell arranged at the crossing of the word line and the bit line, at least one spare cell arranged at the crossing of the spare word line and the bit line, a data inverting circuit generating an inverting signal for inverting data when a memory cell is replaced by a spare cell and the spare cell stores data inverted with respect to data stored in the memory cell, an inverse writing circuit inverting data to be written to the spare cell in response to the inverting signal supplied from the data inverting circuit when data is to be written to the spare cell storing the inverted data, and an inverse reading circuit inverting data to be read out of the spare cell in response to the inverting signal supplied from the data inverting circuit when data is to be read out of the spare cell storing the inverted data.

Therefore, an advantage of the present invention is that the same stress as a memory cell can reliably be applied to a spare cell regardless of spare cell arrangement.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an overall structure of a semiconductor memory device according to a first embodiment of the present invention.

DESCRIPTION OF THE PREFERRED EMBODIMENTS

Figure 2A:
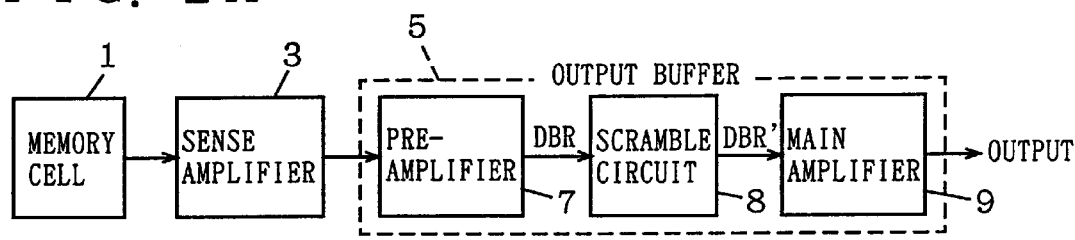
FIGS. 2A and 2B illustrate the operation of the semiconductor memory device shown in FIG. 1.

Now, the embodiments of the present invention will be described in detail with reference to the drawings. The same or corresponding parts throughout the drawings have the same reference characters.

[First Embodiment]

FIG. 1 shows an overall structure of a semiconductor memory device according to a first embodiment of the present invention. As shown in FIG. 1, the semiconductor memory device includes an address buffer 17 receiving and buffering an address signal A0–A9, a row decoder 13 and a column decoder 15 connected to address buffer 17, a spare row decoder 14 selecting a spare word line, a memory cell 1, a sense refresh amplifier input/output controlling circuit 3, a program circuit 19 connected to address buffer 17 and storing an address which indicates the location of a defective memory cell, a block determining portion 16 connected to row decoder 13 and spare row decoder 14, a data scramble controlling circuit 20 connected to program circuit 19 and block determining portion 16, a clock generating circuit 21 receiving a column address strobe signal /CAS and a row address strobe signal /RAS, a logic gate 22 receiving a write enable signal /W and an output signal from clock generating circuit 21, an input buffer 11 receiving data, a scramble circuit 10 connected to input buffer 11, and an output buffer 5 including a preamplifier 7, a scramble circuit 8 and a main amplifier 9 and outputting data.

Figure 8:
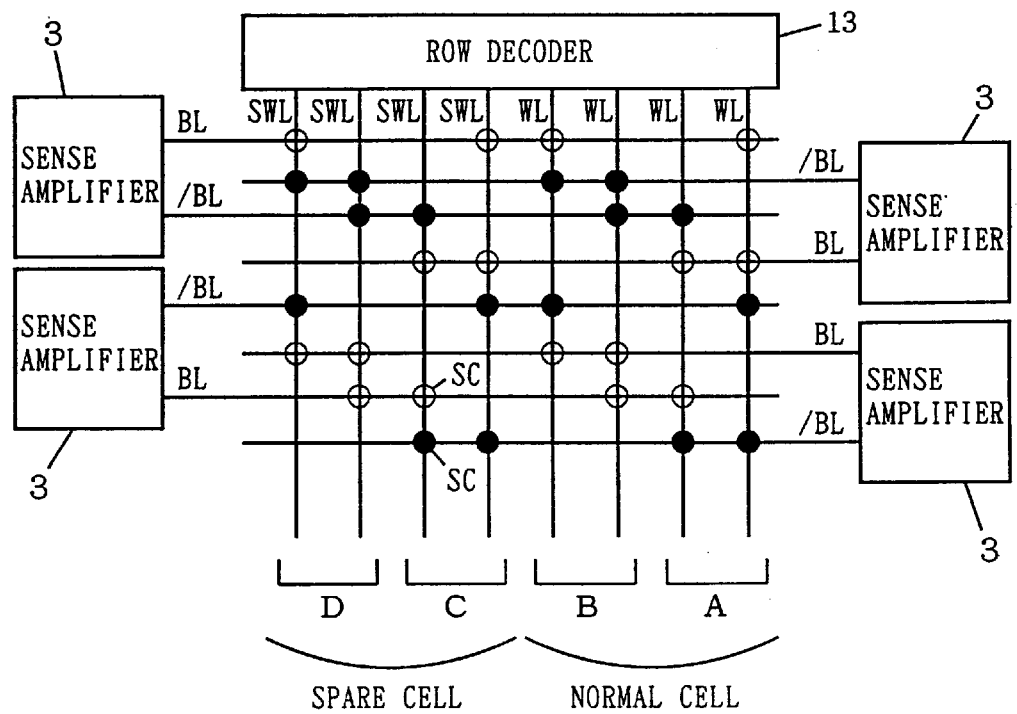
FIG. 8 shows memory cell arrangement in the conventional semiconductor memory device.

Here, memory cell 1 forms an array in which quarter pitch cell arrangement shown in FIG. 8 is one unit.

Figure 3:
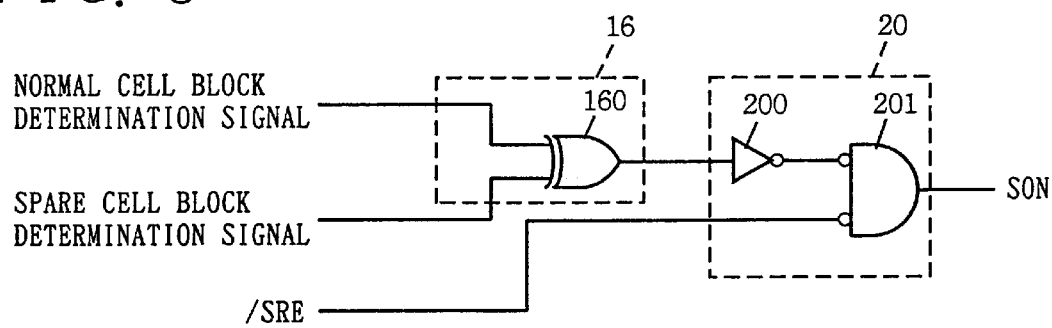
FIG. 3 shows structures of the block determining portion and the data scramble controlling circuit shown in FIG. 1.

FIG. 3 shows structures of block determining portion 16 and data scramble controlling circuit 20 shown in FIG. 1. As shown in FIG. 3, block determining portion 16 includes an exclusive OR circuit 160 which is supplied with a normal cell block determination signal and a spare cell block determination signal.

The normal cell block determination signal is generated in response to a word line selection signal, and it is at the high (H) level when selected word line WL is included in a block A shown in FIG. 8 and at the low (L) level when the word line WL is included in a block B.

Similarly, the spare cell block determination signal is generated in response to a spare word line selection signal, and it is at the H level when selected spare word line SWL is included in a block C shown in FIG. 8 and at the L level when the spare word line is included in a block D.

Data scramble controlling circuit 20 includes an inverter 200 connected to exclusive OR circuit 160, and a logic gate 201 receiving an output signal from inverter 200 and a spare row enable signal /SRE and outputting a scramble ON signal SON.

Now, the operation of the semiconductor memory device according to the embodiment will be described.

Figure 4:
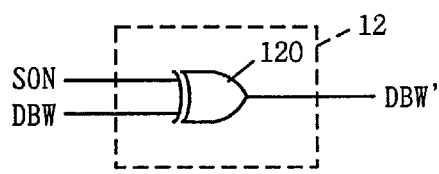
FIG. 4 shows a structure of the scramble circuit shown in FIG. 2B.

First, the data writing operation will be described with reference to FIG. 2B. As shown in FIG. 2B, data DQ1–DQ8 which was input to input buffer 11 is buffered by input buffer 11, and a signal DBW is supplied from input buffer 11 to scramble circuit 12. FIG. 4 is a circuit diagram showing a structure of scramble circuit 12. As shown in FIG. 4, scramble circuit 12 includes an exclusive OR circuit 120 and supplies a signal DBW' which is an inversion of signal DBW to memory cell 1 when scramble ON signal SON is at the H level. When scramble ON signal SON is at the L level, scramble circuit 12 supplies signal DBW which is not inverted to memory cell 1.

Here, the case in which scramble ON signal SON is activated to the H level will be described with reference to FIG. 3. As shown in FIG. 3, spare row enable signal /SRE needs to be activated to the L level so that scramble ON signal SON attains the H level. Spare row enable signal /SRE is a signal which is generated in program circuit 19 and which is activated to the L level when a normal cell which is designated by address signal A0–A9 input to address buffer 1 is replaced by a spare cell.

Scramble ON signal SON is activated only when a normal cell is replaced by a spare cell having different cell arrangement, for example, when block A shown in FIG. 8 is replaced by block D or block B is replaced by block C. In this case, the normal cell block determination signal and the spare cell block determination signal have different levels from each other. Therefore, exclusive OR circuit 160 outputs an H level signal, and logic gate 201 receives an L level signal from inverter 200 and outputs H level scramble ON signal SON.

Then, the data reading operation will be described with reference to FIG. 2A.

Figure 2B:
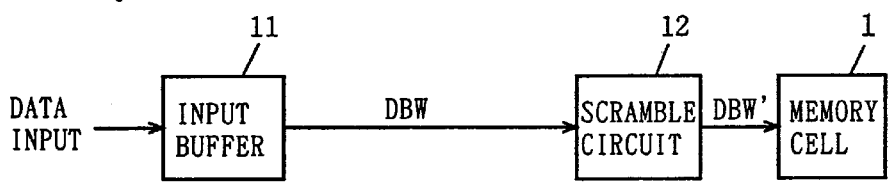
Figure 5:
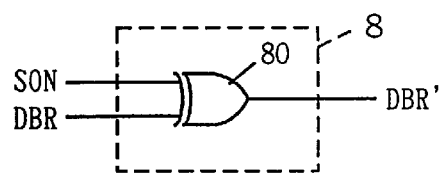
FIG. 5 shows a structure of the scramble circuit shown in FIG. 2A.

As shown in FIG. 2A, data stored in memory cell 1 is supplied to output buffer 5 through sense amplifier 3. Thereafter, the data supplied to output buffer 5 is amplified by preamplifier 7 and signal DBR is supplied to scramble circuit 8. FIG. 5 is a circuit diagram showing a structure of scramble circuit 8. As shown in FIG. 5, scramble circuit 8 includes an exclusive OR circuit 80 and supplies a signal DBR' which is an inversion of signal DBR to main amplifier 9 only when scramble ON signal SON is at the H level.

Scramble ON signal SON attains the H level under the same condition described above.

When scramble ON signal SON is at the L level, scramble circuit 8 supplies signal DBR' which is not inverted to main amplifier 9.

According to the operation described above, when a normal cell is replaced by a spare cell SC and the spare cell SC stores data inverted with respect to the normal cell, the same state of electric charges as the normal cell before replacement with spare cell SC can be achieved by using the inverted data of data which is to be written to the normal cell as data which is to be written to spare cell SC.

When a normal cell is replaced by spare cell SC, therefore, stress can be applied to all cells, for example, in a burn-in test regardless of spare cell SC arrangement.

[Second Embodiment]

Figure 6:
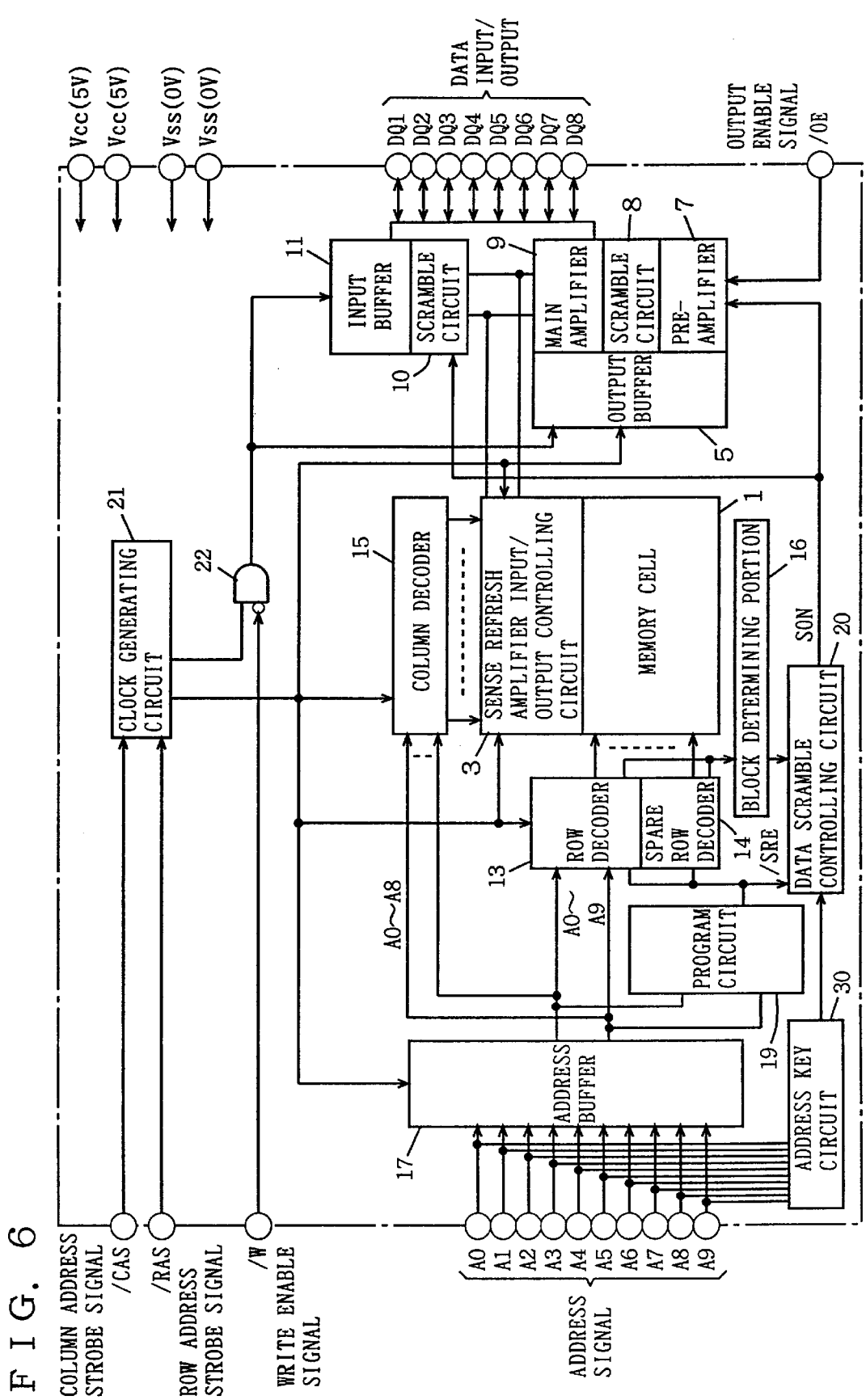
FIG. 6 shows an overall structure of a semiconductor memory device according to a second embodiment of the present invention.
Figure 7A:
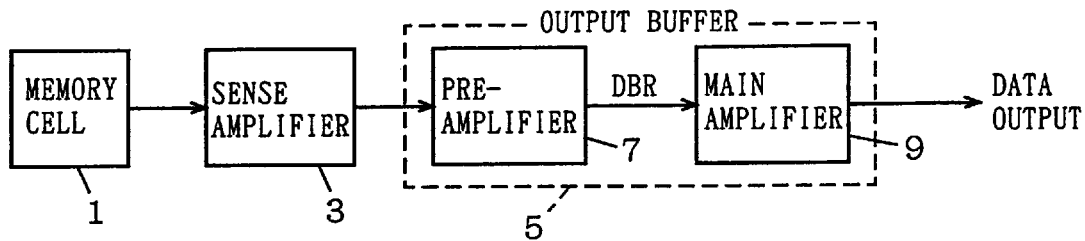
FIGS. 7A and 7B illustrate the operation of a conventional semiconductor memory device.
Figure 7B:
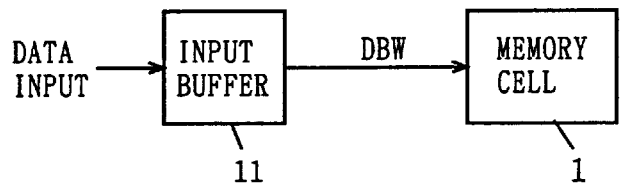

FIG. 6 shows an overall structure of a semiconductor memory device according to a second embodiment of the present invention.

As shown in FIG. 6, the semiconductor memory device has a similar structure to that of the semiconductor memory device shown in FIG. 1 except that the device in this embodiment has an normal operation mode and a test mode and further includes an address key circuit 30 for entering the test mode and generating a test signal according to input address signal A0–A8.

Address key circuit 30 generates the test signal according to the level of address signal A0–A8, and data scramble controlling circuit 20 is activated when this test signal is supplied.

As described above, in the semiconductor memory device according to the second embodiment of the present invention, the data scramble controlling circuit is activated only in the test mode, so that it can prevent lower operating speed caused by data inversion in the normal operation mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a word line;
   a spare word line;
   a plurality of bit lines crossing said word line and said spare word line;
   at least one memory cell arranged at crossings of said word line and said bit lines;
   at least one spare cell arranged at crossings of said spare word line and said bit lines;
   data inverting means for generating an inverting signal for inverting data when said memory cell is replaced by said spare cell and said spare cell stores data inverted with respect to data stored in said memory cell;
   inverse writing means for inverting data to be written to said spare cell according to said inverting signal supplied from said data inverting means when data is written to the spare cell storing said inverted data; and
   inverse reading means for inverting data to be read out of said spare cell according to said inverting signal supplied from said data inverting means when data is read out of the spare cell storing said inverted data.

2. The semiconductor memory device according to claim 1, further comprising:
   replacement determining means for determining whether said memory cell corresponding to an input address has been replaced by said spare cell and generating a spare enable signal when said memory cell has been replaced by said spare cell, wherein
   said data inverting means is activated when said spare enable signal is received.

3. The semiconductor memory device according to claim 2, further comprising:

cell state determining means for determining whether said spare cell replacing said memory cell stores data inverted with respect to data which has been stored in said memory cell according to a word line selection signal selecting said word line and a spare word line selection signal selecting said spare word line, wherein said data inverting means is activated when said cell state determining means determines that said spare cell stores said inverted data, and said data inverting means is inactivated when said cell state determining means determines that said spare cell does not store said inverted data.

4. The semiconductor memory device according to claim 3, further comprising:

an input buffer; and an output buffer including a preamplifier and a main amplifier, wherein said inverse writing means inverses data which is output from said input buffer according to said inverting signal, and said inverse reading means inverses data which is output from said preamplifier according to said inverting signal.

5. The semiconductor memory device according to claim 1, further comprising:

an address key circuit generating a test mode signal according to an externally supplied address signal, wherein said data inverting means is activated according to said test mode signal.

\* \* \* \* \*